United States Patent
Kao

(10) Patent No.: US 8,779,344 B2
(45) Date of Patent: Jul. 15, 2014

(54) IMAGE SENSOR INCLUDING A DEEP TRENCH ISOLATION (DTI) THAT DOES NOT CONTACT A CONNECTING ELEMENT PHYSICALLY

(75) Inventor: Ching-Hung Kao, Hsinchu County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 138 days.

(21) Appl. No.: 13/547,017

(22) Filed: Jul. 11, 2012

(65) Prior Publication Data

US 2014/0015083 A1 Jan. 16, 2014

(51) Int. Cl.
 *H04N 5/335* (2011.01)
 *H01L 27/146* (2006.01)
(52) U.S. Cl.
 CPC .... *H01L 27/14636* (2013.01); *H01L 27/14689* (2013.01)
 USPC .................................................... 250/208.1
(58) Field of Classification Search
 CPC ............... H01L 27/14636; H01L 27/1464; H01L 27/14689
 USPC .......................................... 250/208.1; 438/57
 See application file for complete search history.

(56) References Cited

U.S. PATENT DOCUMENTS

| | | |
|---|---|---|
| 3,930,295 A | 1/1976 | Rose |
| 4,148,048 A | 4/1979 | Takemoto |
| 4,460,912 A | 7/1984 | Takeshita |
| 4,533,624 A | 8/1985 | Sheppard |
| 4,644,172 A | 2/1987 | Sandland |
| 4,745,451 A | 5/1988 | Webb |
| 4,951,104 A | 8/1990 | Kato |
| 5,070,380 A | 12/1991 | Erhardt |
| 5,241,417 A | 8/1993 | Sekiguchi |
| 5,246,803 A | 9/1993 | Hanrahan |
| 5,294,288 A | 3/1994 | Melpolder |
| 5,321,297 A | 6/1994 | Enomoto |
| 5,466,926 A | 11/1995 | Sasano |
| 5,587,696 A | 12/1996 | Su |
| 5,625,210 A | 4/1997 | Lee |
| 5,650,864 A | 7/1997 | Tseng |
| 5,830,624 A | 11/1998 | Bae |
| 5,880,495 A | 3/1999 | Chen |
| 5,977,535 A | 11/1999 | Rostoker |
| 6,006,764 A | 12/1999 | Chu |
| 6,071,826 A | 6/2000 | Cho |
| 6,081,018 A | 6/2000 | Nakashiba |
| 6,087,211 A | 7/2000 | Kalnitsky |
| 6,124,200 A | 9/2000 | Wang |
| 6,294,313 B1 | 9/2001 | Kobayashi |
| 6,297,160 B1 | 10/2001 | Chien |
| 6,338,976 B1 | 1/2002 | Huang |
| 6,352,876 B1 | 3/2002 | Bordogna |

(Continued)

*Primary Examiner* — Thomas L Dickey
(74) *Attorney, Agent, or Firm* — Winston Hsu; Scott Margo

(57) ABSTRACT

An image sensor includes a substrate with a front side and a back side, the substrate having a sensor array region and a peripheral region defined thereon, a plurality of sensor device disposed in the sensor array region, a first metal layer disposed on the front sides within the peripheral region, a bonding pad disposed on the backside within the peripheral region, and at least a connecting element penetrating the substrate and substantially connect to the first metal layer and the bonding pad, wherein parts of the substrate is between the bonding pad and the first metal layer.

18 Claims, 5 Drawing Sheets

(56) References Cited

U.S. PATENT DOCUMENTS

| | | |
|---|---|---|
| 6,369,417 B1 | 4/2002 | Lee |
| 6,376,797 B1 | 4/2002 | Piwczyk |
| 6,388,278 B1 | 5/2002 | Suzuki |
| 6,407,415 B2 | 6/2002 | Lee |
| 6,433,844 B2 | 8/2002 | Li |
| 6,482,669 B1 | 11/2002 | Fan |
| 6,514,810 B1 | 2/2003 | Kim |
| 6,566,151 B2 | 5/2003 | Yeh |
| 6,617,189 B1 | 9/2003 | Lin |
| 6,632,700 B1 | 10/2003 | Fan |
| 6,641,464 B1 | 11/2003 | Steere, III |
| 6,664,191 B1 | 12/2003 | Kim |
| 6,730,555 B2 | 5/2004 | Kim |
| 6,794,215 B2 | 9/2004 | Park |
| 6,821,809 B2 | 11/2004 | Abe |
| 6,841,848 B2 | 1/2005 | MacNamara |
| 6,846,722 B2 | 1/2005 | Lee |
| 6,849,533 B2 | 2/2005 | Chang |
| 6,872,584 B2 | 3/2005 | Nakashiba |
| 6,921,934 B2 | 7/2005 | Patrick |
| 6,933,972 B2 | 8/2005 | Suzuki |
| 6,953,608 B2 | 10/2005 | Leu |
| 6,960,512 B2 | 11/2005 | Cheng |
| 7,006,294 B2 | 2/2006 | Steenblik |
| 7,078,779 B2 | 7/2006 | Wang |
| 7,115,924 B1 | 10/2006 | LaMaster |
| 7,129,172 B2 | 10/2006 | Morrow |
| 7,180,044 B2 | 2/2007 | Yu |
| 7,199,439 B2 | 4/2007 | Farnworth |
| 7,229,745 B2 | 6/2007 | Lamarre |
| 7,315,359 B2 | 1/2008 | Hong |
| 7,328,915 B2 | 2/2008 | Smith |
| 7,498,190 B2 | 3/2009 | Kao |
| 7,648,851 B2 | 1/2010 | Fu |
| 2001/0023086 A1 | 9/2001 | Park |
| 2004/0122328 A1 | 6/2004 | Wang |
| 2005/0024520 A1 | 2/2005 | Yamamoto |
| 2005/0103983 A1 | 5/2005 | Yamaguchi |
| 2005/0121599 A1 | 6/2005 | Mouli |
| 2005/0186739 A1 | 8/2005 | Wang |
| 2005/0247963 A1 | 11/2005 | Chen |
| 2005/0274988 A1 | 12/2005 | Hong |
| 2005/0274996 A1 | 12/2005 | Iwawaki |
| 2006/0054946 A1 | 3/2006 | Baek |
| 2006/0124833 A1 | 6/2006 | Toda |
| 2006/0146230 A1 | 7/2006 | Joon |
| 2006/0146412 A1 | 7/2006 | Kim |
| 2006/0172451 A1 | 8/2006 | Park |
| 2006/0183265 A1 | 8/2006 | Oh |
| 2006/0231898 A1 | 10/2006 | Jeong |
| 2007/0010042 A1 | 1/2007 | Li |
| 2007/0012970 A1 | 1/2007 | Mouli |
| 2007/0018073 A1 | 1/2007 | Hsu |
| 2007/0023851 A1 | 2/2007 | Hartzell |
| 2007/0031988 A1 | 2/2007 | Agranov |
| 2007/0052050 A1 | 3/2007 | Dierickx |
| 2007/0072326 A1 | 3/2007 | Zheng |
| 2007/0096173 A1 | 5/2007 | Kim |
| 2007/0117253 A1 | 5/2007 | Hsu |
| 2007/0158772 A1 | 7/2007 | Boettiger |
| 2007/0166649 A1 | 7/2007 | Yu |
| 2007/0202696 A1 | 8/2007 | Inuiya |
| 2008/0036020 A1 | 2/2008 | Ko |
| 2008/0055733 A1 | 3/2008 | Lim |
| 2008/0079103 A1 | 4/2008 | Liao |
| 2008/0121805 A1 | 5/2008 | Tweet |
| 2008/0121951 A1 | 5/2008 | Kao |
| 2008/0157144 A1 | 7/2008 | Lee |
| 2008/0169546 A1 | 7/2008 | Kwon |
| 2008/0265348 A1 | 10/2008 | Maas |
| 2009/0066954 A1 | 3/2009 | Opsal |
| 2009/0121264 A1 | 5/2009 | Kao |
| 2009/0124037 A1 | 5/2009 | Yu |
| 2009/0127643 A1 | 5/2009 | Lu |
| 2009/0134484 A1 | 5/2009 | Lin |
| 2009/0168181 A1 | 7/2009 | Su |
| 2009/0200585 A1 | 8/2009 | Nozaki |
| 2009/0212335 A1 | 8/2009 | Kao |
| 2009/0256258 A1 | 10/2009 | Kreupl |
| 2009/0294888 A1 | 12/2009 | Tsai |
| 2009/0321862 A1 | 12/2009 | Yu |
| 2010/0003623 A1 | 1/2010 | Liu |
| 2010/0038688 A1 | 2/2010 | Wu |
| 2010/0044813 A1 | 2/2010 | Wu |
| 2010/0096359 A1 | 4/2010 | Shiu |
| 2010/0144156 A1 | 6/2010 | Shih |
| 2010/0155796 A1* | 6/2010 | Koike et al. .................. 257/292 |
| 2010/0159632 A1 | 6/2010 | Rhodes |
| 2010/0315734 A1 | 12/2010 | Wu |
| 2011/0057277 A1 | 3/2011 | Yu |
| 2011/0207258 A1* | 8/2011 | Ahn et al. ....................... 438/70 |
| 2011/0304008 A1 | 12/2011 | Yang |
| 2012/0126096 A1* | 5/2012 | Sugiura et al. ............. 250/208.1 |
| 2012/0242876 A1* | 9/2012 | Hagiwara ..................... 348/294 |

* cited by examiner

IMAGE SENSOR INCLUDING A DEEP TRENCH ISOLATION (DTI) THAT DOES NOT CONTACT A CONNECTING ELEMENT PHYSICALLY

BACKGROUND OF THE INVENTION

1. Field of the Invention

The present invention relates to an image sensor, and more particularly, to an image sensor formed through a back side process.

2. Description of the Prior Art

As the development of electronic products such as digital cameras and scanners progresses, the demand for image sensors increases accordingly. In general, commonly used image sensors are nowadays divided into two main categories: the charge coupled device (CCD) sensors and the CMOS image sensors (CIS). Primarily, CMOS image sensors have certain advantages of low operating voltage, low power consumption, and property of random access. Furthermore, CMOS image sensors can currently be integrated in semiconductor fabrication processes. Based on those benefits, the application of CMOS image sensors has increased significantly.

The CMOS image sensor separates incident light into a combination of light beams of different wavelengths. For example, the CMOS image sensor can consider incident light as a combination of red, blue, and green light. The light of different wavelengths is received by respective optically sensitive elements such as photodiodes and is subsequently transformed into digital signals of different intensities. Thus, it can be seen that a monochromatic color filter array (CFA) must be set above every optical sensor element for separating the incident light.

In conventional process, a CMOS image sensor has a binding pad formed on the surface to connect other components, the manufacturing method of the bonding pad includes: forming an opening to expose the metal trace, filling a conductive material in the opening to form the bonding pad, and after the bonding pad is formed, forming a color filter array and a micro lens. As shown in FIG. 1, which is a schematic drawing illustrating a conventional image sensor. A CMOS image sensor 10 has a dielectric layer 12 and a metal trace 14 on its surface, an opening 16 is formed to expose the metal trace 14, and a conductive layer 18 is then filled in the opening 16 to form a bonding pad and to connect other components. Besides, an insulating layer 21 may be selectively formed on the sidewall of the opening 16 to provide shielding effect and prevent the current flowing through the bonding pad from influencing other components.

Afterwards, a color filter array 36 is formed on the dielectric layer 12 through a spin coating process; a planarizing layer 38 is then formed on the color filter array 36, and a plurality of micro-lenses 40 corresponding to the color filter array 36 are formed on the planarizing layer 38. However, there is an issue in conventional processes: as mentioned above, the color filter array 36 is formed on the dielectric layer 12 through spin coating after the opening 16 is completed. It is worth noting that the existence of the opening 16 has the color filter layer stored up in the opening 16, which is then spun out from the opening 16 during the spin coating step, thereby affecting the uniformity of a thickness of the color filter layer, and causing striation. Striation is disadvantageous to the pixel performances since it affects, for example, the saturation of the CMOS image sensor 10.

SUMMARY OF THE INVENTION

The present invention therefore provides methods for fabricating an image sensor with improved performances and that prevent it from being affected by the striation caused during the formation of the color filters.

The present invention provides an image sensor including a substrate with a front side and a back side, wherein the substrate has a sensor array region and a peripheral region defined thereon, a plurality of image sensor devices disposed in the sensor array region, a first metal layer disposed on the front side within the peripheral region, a bonding pad disposed on the back side within the peripheral region; and at least one connecting element penetrating the substrate and substantially contacting the first metal layer and the bonding pad, wherein parts of the substrate are between the first metal layer and the bonding pad.

The present invention provides a method for fabricating an image sensor. The method comprises steps of providing a substrate with a front side and a back side, wherein the substrate has a sensor array region and a peripheral region defined thereon, forming a first metal layer disposed on the front side within the peripheral region, forming an opening penetrating the substrate from the back side, forming a conductive layer on the back side and in the opening, wherein a connecting element is formed by the conductive layer in the opening, forming a bonding pad through patterning the conductive layer, forming a plurality of color filters on the back side within the sensor array region, forming a planarizing layer disposed on the color filter; and forming a plurality of micro lenses disposed on the planarizing layer.

According to the image sensor provided in the present invention, the bonding pad is formed on the back side of the substrate, and at least a part of the substrate is between the bonding pad and the first metal layer, so that the color filter layer would not be stored up in the opening/recess during the spin coating process. Thus the effect of striation to the pixel performance of the image sensor is prevented as the striation itself is prevented.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 2:
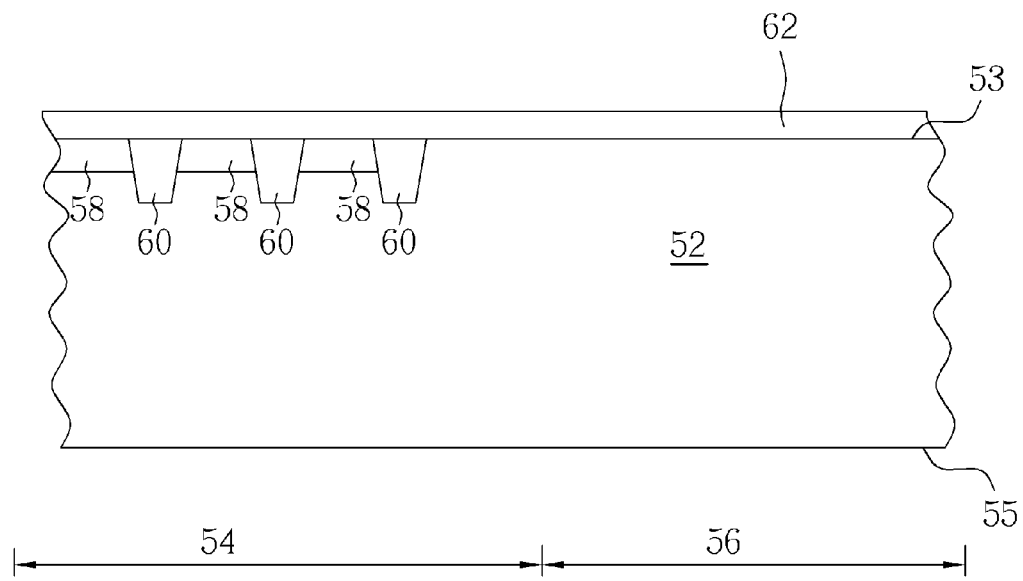
FIGS. 2~6 are schematic, cross-sectional view diagrams showing a method for fabricating an image sensor according to the first preferred embodiment of the present invention.

Please refer to FIGS. 2~7, FIGS. 2~7 are schematic, cross-sectional view diagrams showing a method for fabricating an image sensor according to the first preferred embodiment of the present invention. As shown in FIG. 2, at first, a substrate 52 with a front side 53 and a back side 55 is provided, wherein the substrate 52 has a sensor array region 54 and a peripheral region 56 defined thereon. A plurality of photodiodes 58 for receiving light, a plurality of insulators, such as shallow trench isolations (STIs) 60 positioned between each photodiode 58, and a plurality of transistors (not shown) are formed in the substrate 52 within the sensor array region 54 starting from the front side 53. Then, at least an inter layer dielectric (ILD) 62 is formed on the front side 53, and a plurality of contact plugs (not shown) is then formed in the ILD 62.

Figure 3:
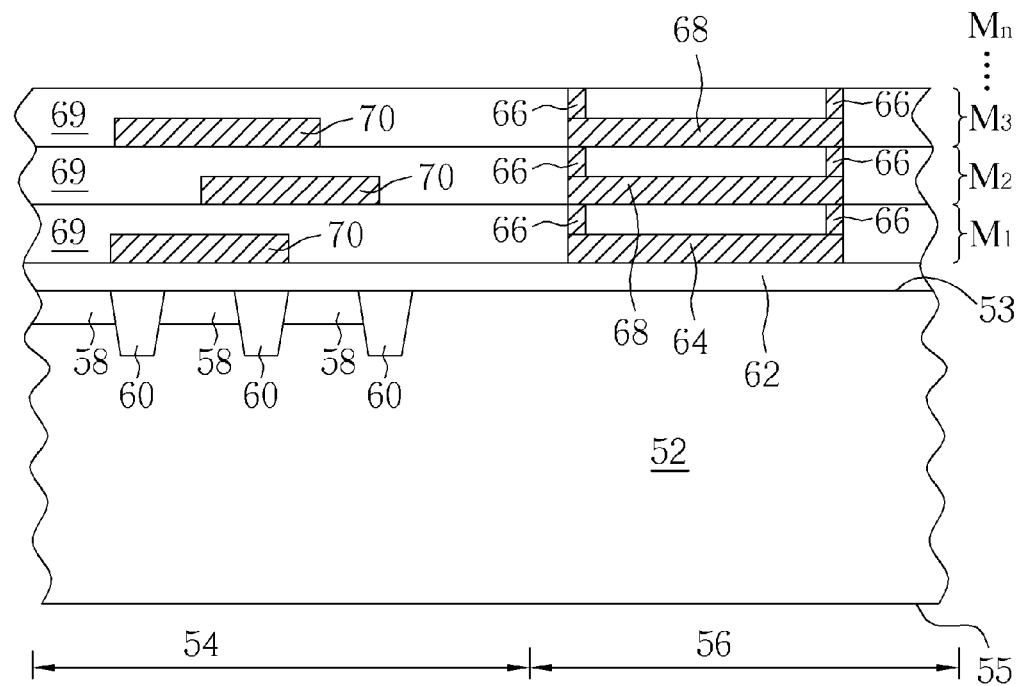

Please refer to FIG. 3. In FIG. 3, at least a metal interconnection process is performed, a dielectric layer 69 is formed on the ILD 62, a first metal layer 64 is then formed in the dielectric layer 69 within the peripheral region 56, and a plurality of via plugs 66 is formed on the first metal layer 64 in order to serve as the connection between the image sensor and other components. Besides, the image sensor further comprises a plurality of metal traces 70 and a plurality of via plugs (not shown) in the dielectric layer 69 within the sensor array region 54. In addition, the dielectric layer 69 can be a multi layer structure wherein each layers is similar to the dielectric layer 69, including a metal layer 68, a plurality of via plugs 66 and a plurality of metal traces 70. It is worth noting that the first metal layer 64 is disposed on the ILD 62 and directly contacts the ILD 62.

Figure 4:
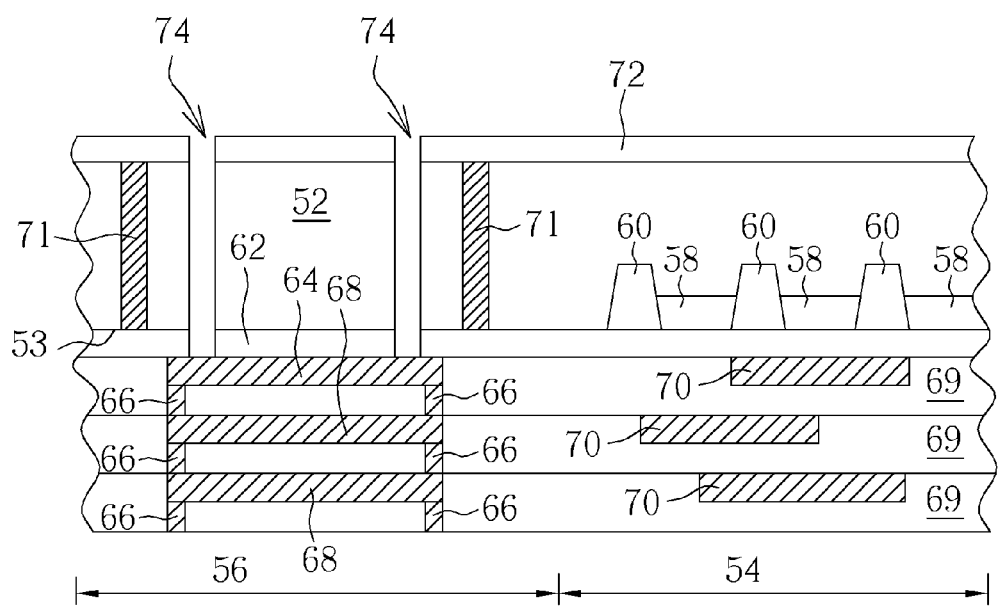

The substrate 52 is then turned upside down; the back side 55 of the substrate 52 is grinded to thin down the substrate 52. As shown in FIG. 4, a cap layer 72 is formed on the back side 55 of the substrate 52, the cap layer 72 includes silicon nitride (SiN) or silicon oxide (SiO2), but not limited thereto. An opening 74 is then formed, wherein the opening 74 penetrates the cap layer 72, the substrate 52 and the ILD 62 to expose the first metal layer 64. In addition, the present invention further comprises forming a plurality of deep trench isolation (DTI) 71, wherein the DTI 71 disposed in the substrate 52 surround the opening 74. In the present invention, the DTI 71 can be formed from the front side 53 together with the formation of the STI 60 or before/after the formation of the STI 60, or formed from the back side after the substrate is thinned down. The DTI 71 may include insulating materials or conductive materials to electrically isolate the bonding pad (formed in subsequent steps) from the substrate in the sensor array region 54. When the DTI 71 includes conductive materials, the DTI 71 should be floating and electrically isolated from the bonding pad.

Figure 5:
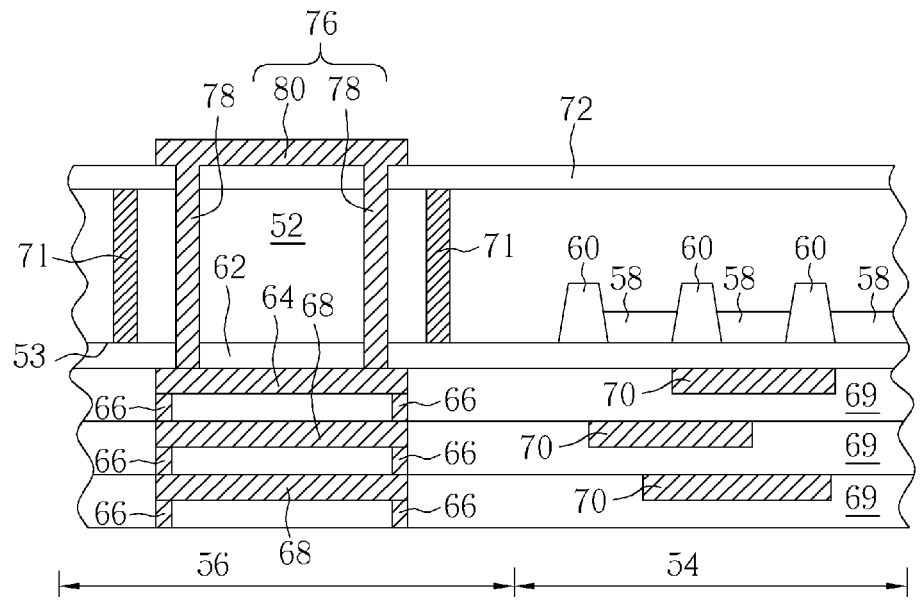

As shown in FIG. 5, a conductive layer 76 is then formed on the back side of the substrate 52, so as to cover the cap layer 72 and fill the opening 74, wherein the conductive layer 76 filled in the opening 74 forms a connecting element 78. A patterned photo resist layer (not shown) serves as a cap layer to carry out an etching process to pattern the conductive layer 76 so as to form a bonding pad 80 on the cap layer 72. It is worth noting that the connecting element 78 and the bonding pad 80 are monolithically formed with identical material. Besides, the connecting element 78 consists only of a single layer of the conductive layer 76, and the connecting element 78 substantially contacts the substrate 52. In other words, the connecting element 78 is not formed with multiple metal layers, but only formed with the conductive layer 76 located in the opening 74 and it directly contacts the substrate 52. In addition, since the DTI 71 is disposed surrounding the opening 74 and does not contact the opening 74 physically, therefore, after the opening 74 is filled by the conductive layer 76, the DTI 71 does not contact the connecting element 78 physically, either. The conductive layer 76 includes Al, AlCu alloy or AlSiCu alloy, but not limited thereto.

Figure 6:
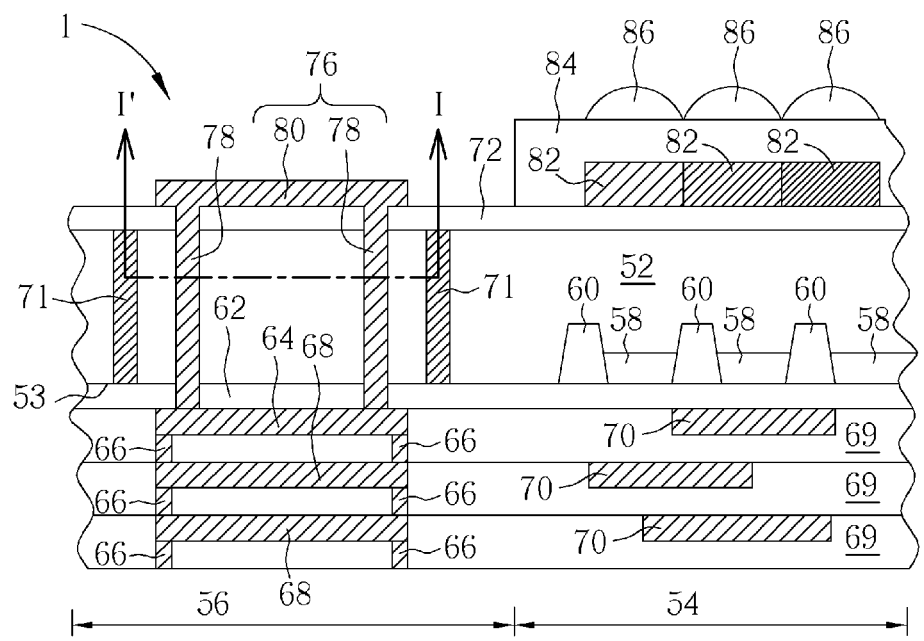

Please refer to FIG. 6. A plurality of color filters 82 is formed on the cap layer 72 of the sensor array region 54. The steps for forming the color filters 82 can be summarized as follows: performing a first spin coating process to form a first color filter layer (i.e. blue, not shown) and a first pattern transferring step is then performed with a photomask having a first color filter pattern in order to form at least a first color filter on the cap layer 72 of the sensor array region 54. Then a second spin coating process is performed to form a second color filter layer (i.e. green, not shown) and a second pattern transferring step is performed with a photomask having a second color filter pattern to form at least a second color filter on the cap layer 72 of the sensor array region 54. And a third spin coating process is performed to form a third color filter layer (i.e. red, not shown) and a third pattern transferring step is performed with a photomask having a third color filter pattern to form at least a third color filter on the cap layer 72 of the sensor array region 54. After forming the color filters 82, a planarizing layer 84 is formed on the color filters 82 through a deposition and an etching process. Then, a plurality of micro lenses 86 is formed on the planarizing layer 84 to complete an image sensor 1 of the present invention.

A specific feature of the present invention is that the bonding pad 80 formed on the back side 55 of the substrate 52 contacts the first metal layer 64 through the connecting element 78 penetrating the substrate 52 and the ILD 62. In other words, the substrate 52 and the ILD 62 are between the bonding pad 80 and the first metal layer 64, and the connecting element 78 contacts the substrate 52 directly. There is no barrier layer or dielectric layer between the connecting element 78 and the substrate 52. Thus, upon the formation of the bonding pad 80, an opening (or a recess) will therefore not be formed on a surface of the substrate 52 which would have the color filter layer stored up in the opening/recess and get spun out from the opening/recess during the spin coating step. This way, the striation is prevented.

Figure 1:
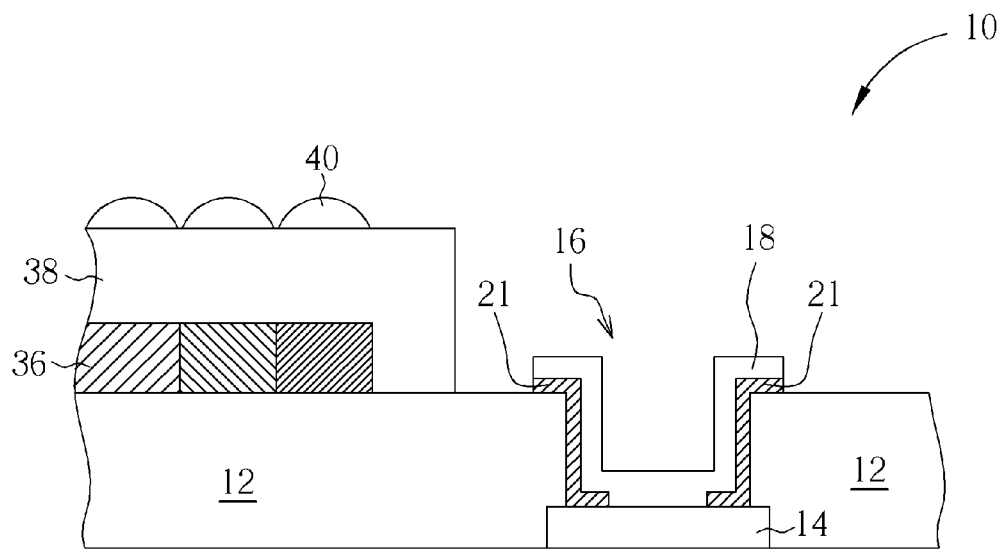
FIG. 1 is a schematic drawing illustrating parts of a conventional image sensor.

Another specific feature of the present invention is the DTI 71. In the present invention, the insulating layer (DTI 71) and the connecting element 78 are formed in different openings and the DTI 71 is disposed in the substrate 52 surrounding the bonding pad 80 and all of the connecting elements 78, in other words, the DTI 71 in the present invention replaces the conventional insulating layer 21 (shown in FIG. 1) to shield the bonding pad 80 and the connecting element 78. Therefore, the destruction of the connecting element 78 caused by repeated etching in the same opening will be prevented.

Figure 7:
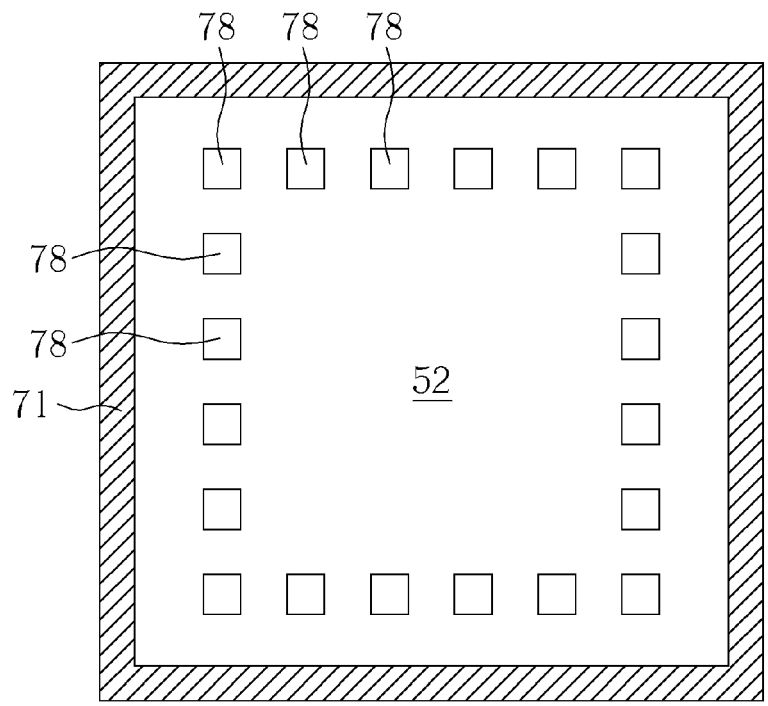
FIG. 7 is a bottom view diagram of the cross section line I-I' in FIG. 6 accordance with the first preferred embodiment.
Figure 8:
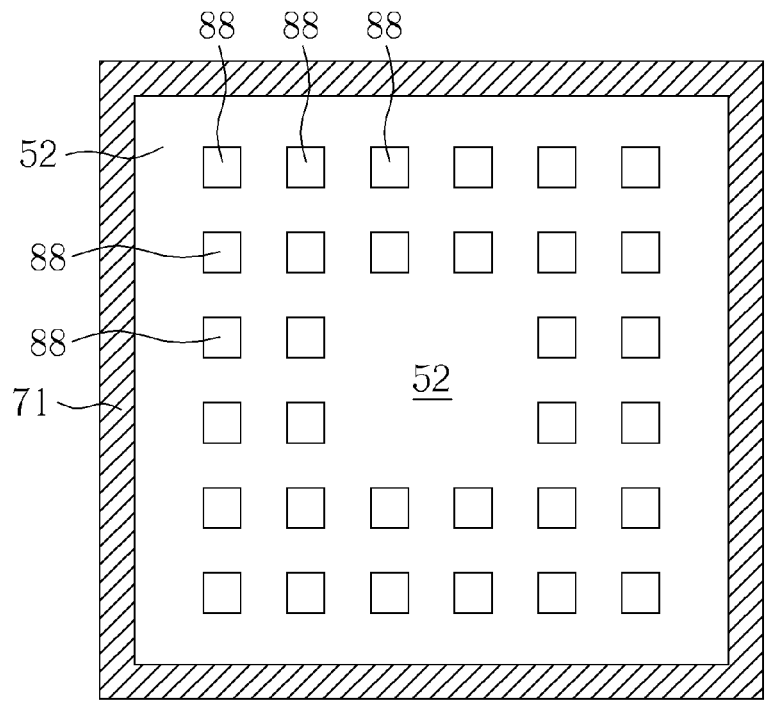
FIG. 8~10 are bottom view diagrams of the cross section line I-I' in FIG. 6 according to three different embodiments.
Figure 9:
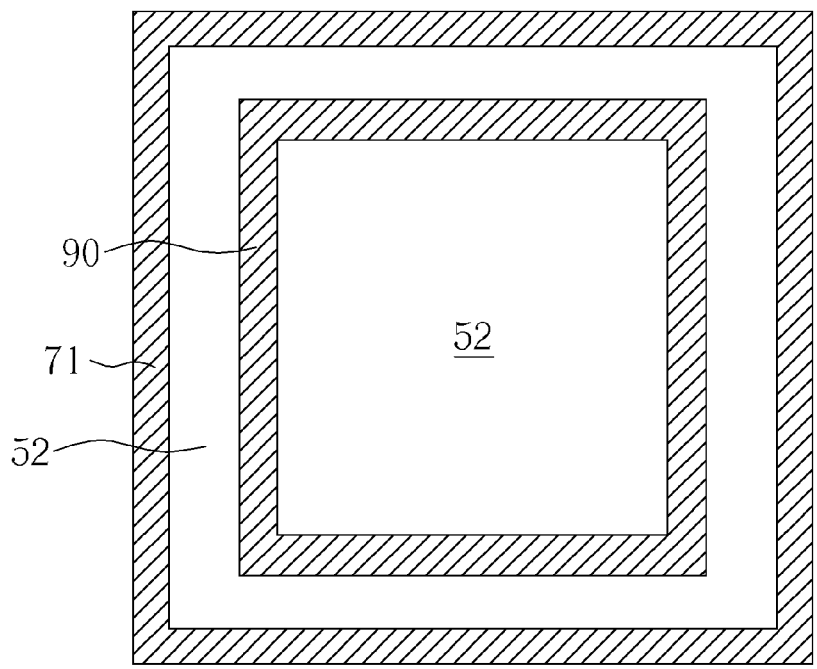
Figure 10:
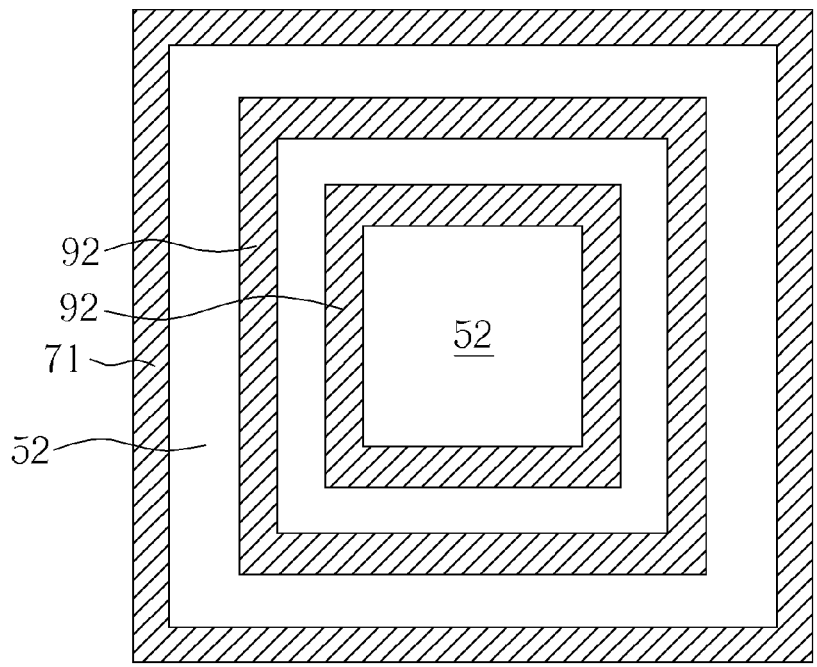

In the present invention, each connecting elements can be arranged in different ways. FIG. 7 is a bottom view diagram of the cross section line I-I' in FIG. 6 in accordance with the first preferred embodiment. As shown in FIG. 7, each of the connecting elements 78 is pole-shaped, and the connecting elements 78 are arranged along the inner edge of the first metal layer 64 with a square shape. In addition, the DTI 71 surrounds the bonding pad (not shown) and all of the connecting elements 78. In this embodiment, the cross section of each connecting element 78 is square-shaped, and the edge of each connecting elements 78 is preferred to be comprised between 1.5 μm~3 μm, the edge of the bonding pad 80 is preferred to be comprised between 30 μm~100 μm. Besides, the present invention further comprises different embodiments shown in FIGS. 8~10. FIGS. 8~12 are bottom view diagrams of the cross section line I-I' in FIG. 6 in accordance with three different embodiments. As shown in FIG. 8, each of the connecting elements 88 is a pole structure, and all of the connecting elements 88 are arranged in concentric squares. As shown in FIG. 9, the connecting element 90 is a square shape structure, or as shown in FIG. 10, the connecting element 92 is a square shape structure arranged in concentric squares. Of course, the present invention is not limited thereto and the connecting elements can be arranged in others shapes.

To summarize the above descriptions, the present invention provides an image sensor and the fabricating method thereof. When the bonding pad is formed on the back side of the substrate, at least parts of the substrate and the ILD are between the bonding pad and the first metal layer, and no opening or recess will be formed on the surface of the substrate, which avoids the color filter layer from being stored up in the opening/recess and then get spun out from the opening/recess during the spin coating step. In this way the striation is prevented. Besides, a plurality of DTI is disposed in the substrate surrounding the bonding pad, wherein the DTI and the connecting elements are formed in different openings. The destruction of the connecting elements caused by repeated etching in the same opening will be prevented, thereby improving the performances of the image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
a substrate with a front side and a back side, wherein the substrate has a sensor array region and a peripheral region defined thereon;
a plurality of image sensor devices disposed in the sensor array region;
a first metal layer disposed on the front side within the peripheral region;
a bonding pad disposed on the back side within the peripheral region;
at least one connecting element penetrating the substrate and substantially contacting to the first metal layer and the bonding pad, wherein parts of the substrate are between the first metal layer and the bonding pad;
at least one deep trench isolation (DTI) disposed in the substrate surrounding the bonding pad, wherein the DTI does not contact the connecting element physically.

2. The image sensor of claim 1, wherein the DTI includes insulating materials or conductive materials and the DTI is electrically isolated from the bonding pad.

3. The image sensor of claim 1, further comprising an inter layer dielectric (ILD) disposed on the front side, wherein the first metal layer is disposed on the ILD, and the connecting element penetrates the substrate and the ILD to contact the first metal layer directly, and parts of the substrate and the ILD are between the first metal layer and the bonding pad.

4. The image sensor of claim 1, further comprising a cap layer disposed on the back side of the substrate.

5. The image sensor of claim 1, wherein the connecting element includes a pole-shaped structure or a ring-shaped structure.

6. The image sensor of claim 1, wherein each of the connecting elements penetrates the substrate and directly contacts the first metal layer and the bonding pad, arranged in a ring shape.

7. The image sensor of claim 1, wherein the connecting element and the bonding pad are monolithically formed, the connecting element and the bonding pad include Al, AlCu alloy or AlSiCu alloy.

8. The image sensor of claim 1, wherein the connecting element contacts the substrate directly.

9. The image sensor of claim 1, further comprising a planarizing layer disposed on the back side within the sensor array region, a plurality of color filters disposed in the planarizing layer and a plurality of micro lenses disposed on the planarizing layer.

10. The image sensor of claim 1, wherein the image sensor device includes a plurality of photodiodes disposed in the substrate within the sensor array region.

11. A manufacturing method of an image sensor, comprising:
providing a substrate with a front side and a back side, wherein the substrate has a sensor array region and a peripheral region defined thereon;
forming a first metal layer disposed on the front side within the peripheral region;
forming an opening penetrating the substrate from the back side;
forming at least one deep trench isolation (DTI) disposed in the substrate;
forming a conductive layer on the back side and in the opening, wherein a connecting element is formed by the conductive layer in the opening, and the DTI does not contact the connecting element physically; and
forming a bonding pad through patterning the conductive layer, wherein the DTI surrounds the bonding pad.

12. The manufacturing method of an image sensor of claim 11, wherein the connecting element substantially contacts the substrate.

13. The manufacturing method of an image sensor of claim 11, wherein the DTI includes insulating materials or conductive materials and the DTI is electrically isolated from the bonding pad.

14. The manufacturing method of an image sensor of claim 11, wherein the DTI is formed from the front side before the first metal layer is formed.

15. The manufacturing method of an image sensor of claim 11, wherein the DTI is formed through the back side after the first metal layer is formed.

16. The manufacturing method of an image sensor of claim 11, further comprising forming an inter layer dielectric (ILD) disposed on the front side, wherein the first metal layer is disposed on the ILD, and the connecting element penetrates the substrate and the ILD to contacts the first metal layer directly, and parts of the substrate and the ILD is between the first metal layer and the bonding pad.

17. The manufacturing method of an image sensor of claim 11, wherein each of the connecting elements is arranged in a ring shape.

18. The manufacturing method of an image sensor of claim 11, further comprising forming a plurality of photodiodes disposed in the substrate within the sensor array region, forming a plurality of color filters on the back side within the sensor array region, forming a planarizing layer disposed on the color filter; and forming a plurality of micro lenses disposed on the planarizing layer.

* * * * *